US008748236B2

(12) United States Patent
Tanida (10) Patent No.: US 8,748,236 B2
(45) Date of Patent: Jun. 10, 2014

(54) METHOD FOR MANUFACTURING SEMICONDUCTOR DEVICE

(75) Inventor: Atsushi Tanida, Nisshin (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 0 days.

(21) Appl. No.: 13/578,131

(22) PCT Filed: Nov. 10, 2010

(86) PCT No.: PCT/JP2010/070055
§ 371 (c)(1),
(2), (4) Date: Aug. 9, 2012

(87) PCT Pub. No.: WO2012/063342
PCT Pub. Date: May 18, 2012

(65) Prior Publication Data
US 2012/0309208 A1 Dec. 6, 2012

(51) Int. Cl.
*H01L 21/268* (2006.01)
*H01L 21/761* (2006.01)
*H01L 29/739* (2006.01)
*H01L 21/78* (2006.01)
*H01L 29/32* (2006.01)
*H01L 27/12* (2006.01)

(52) U.S. Cl.
USPC .......... 438/133; 438/795; 438/463; 438/535; 257/656; 257/E21.328; 257/E21.135; 257/E21.347; 257/E21.382; 257/E29.066; 257/E29.109

(58) Field of Classification Search
CPC . H01L 21/76826; H01L 21/324; H01L 21/78; H01L 21/3225; H01L 21/76825; H01L 27/1285; H01L 21/268; H01L 21/761; H01L 29/0619; H01L 29/32; H01L 29/7397; H01L 29/8611
USPC .......... 438/795, 133, 463, 535; 257/E21.328, 257/E21.318, E21.135, 656, E21.347, 257/E21.382, E29.066, E29.109
See application file for complete search history.

(56) References Cited

U.S. PATENT DOCUMENTS

| 5,528,058 | A  | * | 6/1996  | Pike et al.    | 257/142 |
| 6,274,892 | B1 | * | 8/2001  | Kub et al.     | 257/131 |
| 7,714,251 | B2 | * | 5/2010  | Miyairi        | 219/121.83 |
| 8,124,501 | B2 | * | 2/2012  | Kurita         | 438/473 |
| 8,304,829 | B2 | * | 11/2012 | Yedinak et al. | 257/334 |

(Continued)

FOREIGN PATENT DOCUMENTS

| JP | 62-112161 A | 5/1987 |
| JP | 08-102545 A | 4/1996 |

(Continued)

OTHER PUBLICATIONS

International Search Report mailed Feb. 15, 2011 & Written Opinion of PCT/JP2010/070055.

*Primary Examiner* — Jarrett Stark
*Assistant Examiner* — Bitew Dinke
(74) *Attorney, Agent, or Firm* — Kenyon & Kenyon LLP (57) ABSTRACT

A method for manufacturing a semiconductor device includes irradiating light to an effective region of a semiconductor substrate. A wavelength of the light is a wavelength adapted so that light absorptance of the semiconductor substrate increases if an intensity of the light increases. The light is irradiated so that a focus point of the light is made within the semiconductor substrate in the irradiating.

3 Claims, 10 Drawing Sheets

(56) References Cited

U.S. PATENT DOCUMENTS

| | | | |
|---|---|---|---|
| 8,334,193 B2* | 12/2012 | Iwasaki et al. | 438/478 |
| 2002/0153360 A1* | 10/2002 | Yamazaki et al. | 219/121.66 |
| 2004/0041225 A1 | 3/2004 | Nemoto | |
| 2005/0059263 A1* | 3/2005 | Nakazawa et al. | 438/784 |
| 2005/0150254 A1* | 7/2005 | Morita et al. | 65/29.18 |
| 2006/0138607 A1* | 6/2006 | Nemoto | 257/656 |
| 2006/0278925 A1* | 12/2006 | Yamaguchi | 257/341 |
| 2007/0080407 A1* | 4/2007 | Kono | 257/370 |
| 2007/0087488 A1* | 4/2007 | Moriwaka | 438/149 |
| 2007/0202619 A1* | 8/2007 | Tamura et al. | 438/22 |
| 2007/0207595 A1 | 9/2007 | Kurita | |
| 2008/0122001 A1* | 5/2008 | Pfirsch et al. | 257/368 |
| 2008/0246096 A1 | 10/2008 | Sakakibara et al. | |
| 2009/0004828 A1 | 1/2009 | Kobayashi | |
| 2009/0242032 A1 | 10/2009 | Yamazaki | |
| 2010/0327416 A1* | 12/2010 | Fukumitsu | 257/618 |
| 2011/0037149 A1* | 2/2011 | Fukuyo et al. | 257/620 |
| 2011/0086471 A1* | 4/2011 | Kazama et al. | 438/135 |
| 2011/0124160 A1* | 5/2011 | Nemoto | 438/133 |
| 2011/0165703 A1* | 7/2011 | Kubo | 438/7 |
| 2012/0001302 A1* | 1/2012 | Matsumura et al. | 257/622 |
| 2012/0064706 A1* | 3/2012 | Nemoto et al. | 438/514 |
| 2013/0119432 A1* | 5/2013 | Lu | 257/139 |
| 2013/0122663 A1* | 5/2013 | Lu | 438/138 |

FOREIGN PATENT DOCUMENTS

| | | |
|---|---|---|
| JP | 10-022495 A | 1/1998 |
| JP | 2003-224281 A | 8/2003 |
| JP | 2003-318412 A | 11/2003 |
| JP | 2004-221193 A | 8/2004 |
| JP | 2005-203596 A | 7/2005 |
| JP | 2008-177203 A | 7/2008 |
| JP | 2008258313 A | 10/2008 |
| JP | 2003264194 A | 9/2009 |
| JP | 2009-260310 A | 11/2009 |

* cited by examiner

METHOD FOR MANUFACTURING SEMICONDUCTOR DEVICE

This is a 371 national phase application of PCT/JP2010/070055 filed 10 Nov. 2010, the contents of which are incorporated herein by reference.

TECHNICAL FIELD

The technique disclosed in this specification relates to a method for manufacturing a semiconductor device having a semiconductor layer that has crystal defects formed therein.

BACKGROUND ART

A technique for forming crystal defects in a semiconductor substrate by implanting charged particles (electrons or ions) into the semiconductor substrate is known. For example, Japanese Patent Application Publication No. 2008-177203 (herein after referred to as a patent document 1) discloses a technique for forming crystal defects in a semiconductor substrate by implanting impurity ions into the semiconductor substrate. By forming the crystal defects in the semiconductor substrate, it is possible to shorten a lifetime of carriers in a region where the crystal defects have been formed. Characteristics of the semiconductor device can thus be controlled.

SUMMARY OF INVENTION

Technical Problem

In the above-described technique involving the implantation of charged particles, the charged particles are implanted along a thickness direction of the semiconductor substrate. In this case, a depth to which the charged particles penetrate into the semiconductor substrate (that is, stopping positions of the charged particles in the thickness direction of the semiconductor substrate) can be controlled by controlling acceleration energy of the charged particles. The crystal defects are mostly formed at the stopping positions of the charged particles. Therefore, by controlling the energy at which the charged particles are implanted, it is possible to control the position of crystal defects in the thickness direction of the semiconductor substrate. However, the crystal defects are formed not only at the positions where the charged particles stop, but also in movement paths of the charged particles. A problem associated with the conventional methods for forming the crystal defects is that the crystal defects are also formed at a depth other than the target depth for the formation of the crystal defects.

Accordingly, the present description provides a technique making it possible to form crystal defects at a target depth, while suppressing formation of the crystal defects at a depth other than the target depth.

Solution to Problem

The present specification discloses a method for manufacturing a semiconductor device. This manufacturing method includes a step of irradiating light to an effective region of a semiconductor substrate. A wavelength of the light is a wavelength adapted so that light absorptance of the semiconductor substrate increases if an intensity of the light increases. In the abovementioned step, the light is irradiated so that a focus point of the light is made within the semiconductor substrate in the irradiating.

The meaning of "light absorptance of the semiconductor substrate increases if an intensity of the light increases" hereinabove includes that the higher is the intensity of the light, the higher is the light absorptance (that is, the light absorptance rises continuously), and also that if the intensity of the light exceeds a predetermined value, the light absorptance of the semiconductor substrate increases (that is, the light absorptance rises in a stepwise manner). For example, light may be used with a wavelength such that when the intensity of the light is less than the predetermined value, the light absorptance of the semiconductor substrate is low, and when the intensity of the light becomes equal to or higher than the predetermined value, two-photon absorption occurs and the light absorptance of the semiconductor substrate increases.

The "effective region" as referred to hereinabove includes a region other than a region which will be end surfaces of the semiconductor substrate (end surfaces of the semiconductor substrate formed by dicing). The light should be irradiated to the effective region, but it is preferred that the light is irradiated to a region where an electric current flows When the semiconductor device is used (that is, a region though which carriers pass).

In this manufacturing method, the light is irradiated so that the focus point of the light is made within the semiconductor substrate. Since the intensity of the light is low in a region other than the focus point, the light absorptance of the semiconductor substrate is low. Therefore, in the region other than the focus point, the semiconductor substrate easily transmits the light. As a consequence, in the region other than the focus point, the crystal defects are unlikely to be formed. Meanwhile, the intensity of the light is high in the focus point and therefore, the light absorptance of the semiconductor substrate is high therein. For this reason, in the focus point, the semiconductor substrate absorbs the light. Therefore, the crystal defects are formed in the focus point position in the semiconductor substrate. Thus, with the manufacturing method, the crystal defects can be formed at the focus point position, while inhibiting the formation of the crystal defects in regions other than the focus point. Therefore, by positioning the focus point at the target depth for forming the crystal defects, it is possible to form the crystal defects at the target depth, while inhibiting the formation of crystal defects at depths other than the target depth. According to such manufacturing method, the crystal defects can be freely distributed in the semiconductor substrate by moving the focus point position in the semiconductor substrate.

In the above-described manufacturing method, the focus point may be preferably moved along a depth direction of the semiconductor substrate in the irradiating.

With such configuration, the crystal defects can be distributed along the thickness direction of the semiconductor substrate. With the conventional technique for implanting charged particles, the crystal defects also can be distributed along the thickness direction of the semiconductor substrate. However, with the conventional technique, a density of the crystal defects formed at the stopping positions of the charged particles is different from a density of the crystal defects formed in the movement paths of the charged particles. Therefore, a density distribution of the crystal defects in the thickness direction of the semiconductor substrate cannot be controlled. By contrast, with the present technique, the density distribution of the crystal defects in the thickness direction of the semiconductor substrate can be controlled by controlling the intensity of the light or a movement speed when the focus point is moved in the depth direction of the semiconductor substrate. Therefore, with the present technique, the crystal defects can be distributed in a manner that cannot be achieved with the conventional technique.

DESCRIPTION OF EMBODIMENTS

Embodiment

Figure 1:
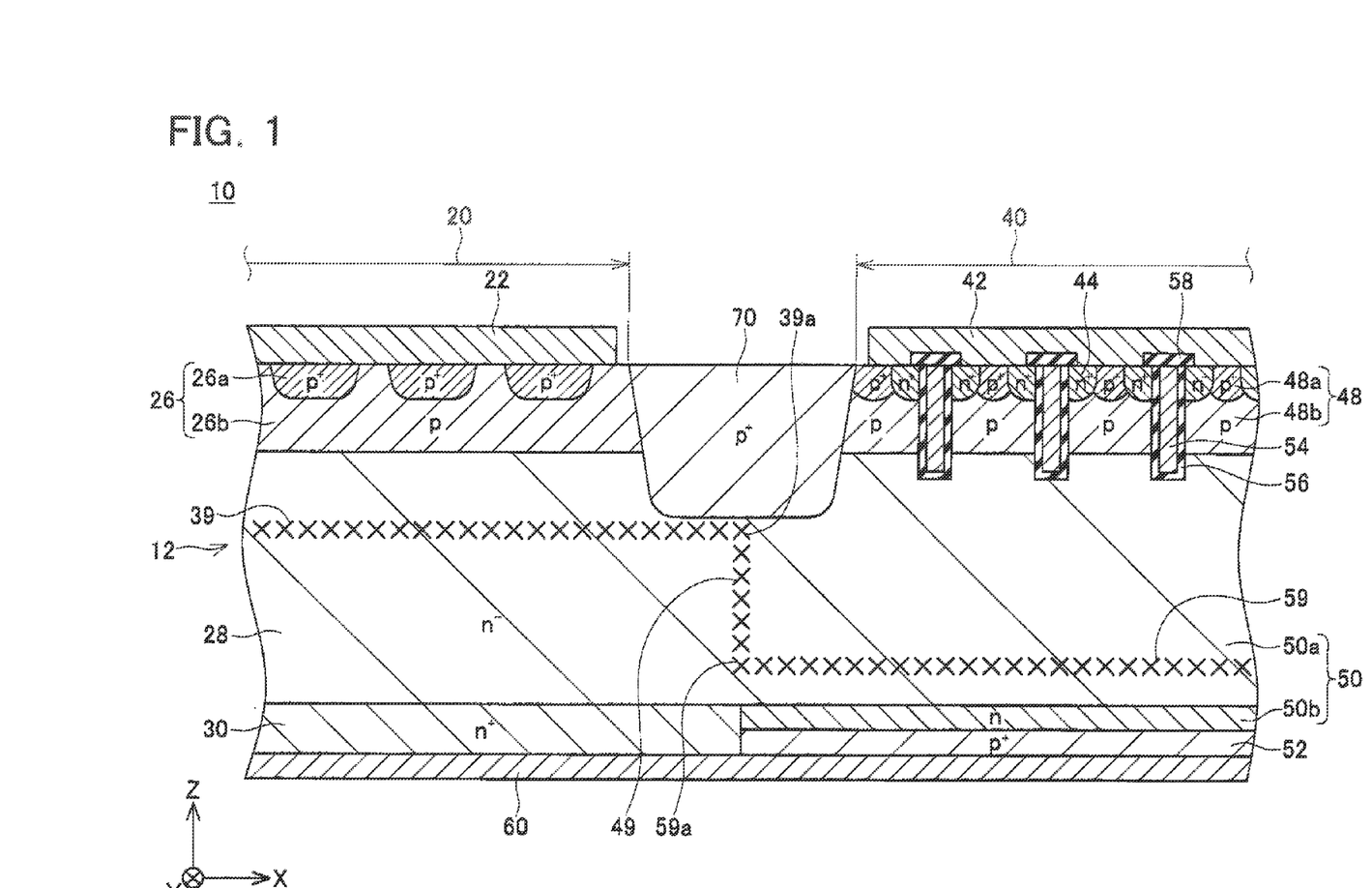
FIG. 1 is a cross-sectional view of the semiconductor device 10.

FIG. 1 is a vertical sectional view of a semiconductor device 10 manufactured by the manufacturing method of the embodiment. The semiconductor device 10 is provided with a semiconductor substrate 12 made of silicon, and metal layers and insulating layers formed on an upper surface and a lower surface of the semiconductor substrate 12. A diode region 20 and an IGBT region 40 are formed on the semiconductor substrate 12. In the explanation below, a direction from the diode region 20 toward the IGBT region 40 is referred to as an X direction, a thickness direction of the semiconductor substrate 12 is referred to as a Z direction, and a direction perpendicular to the X direction and the Z direction is referred to as a Y direction.

An anode electrode 22 is farmed on the upper surface of the semiconductor substrate 12 in the diode region 20. An emitter electrode 42 is formed on the upper surface of the semiconductor substrate 12 in the IGBT region 40. A common electrode 60 is formed on the lower surface of the semiconductor substrate 12.

An anode layer 26, a diode drift layer 28, and a cathode layer 30 are formed in the diode region 20.

The anode layer 26 is a p-type layer. The anode layer 26 is provided with anode contact regions 26a and a low-concentration anode layer 26b. The anode contact regions 26a are formed in an island-like manner within ranges exposed on the upper surface of the semiconductor substrate 12. The anode contact regions 26a have a high impurity concentration. The anode contact regions 26a are ohmically connected to the anode electrode 22. The low-concentration anode layer 26b is formed under and on the sides of the anode contact regions 26a. An impurity concentration of the low-concentration anode layer 26b is lower than that of the anode contact regions 26a.

The diode drift layer 28 is formed under the anode layer 26. The diode drift layer 28 is an n-type layer and has a low impurity concentration.

The cathode layer 30 is formed under the diode drive layer 28. The cathode layer 30 is formed in a range exposed on the lower surface of the semiconductor substrate 12. The cathode layer 30 is an n-type layer and has a high impurity concentration. The cathode layer 30 is ohmically connected to the common electrode 60.

A diode is formed by the anode layer 26, the diode drift layer 28, and the cathode layer 30.

Emitter regions 44, a body layer 48, an IGBT drift layer 50, a collector layer 52, gate electrodes 54 and so on are formed in the IGBT region 40.

A plurality of trenches is formed on the upper surface of the semiconductor substrate 12 in the IGBT region 40. A gate insulating film 56 is formed on an inner surface of each trench. The gate electrode 54s are formed inside the trenches. Upper surfaces of the gate electrodes 54 are covered by an insulating film 58. The gate electrodes 54 are insulated from the emitter electrode 42.

The emitter regions 44 are formed in an island-like manner in ranges exposed on the upper surface of the semiconductor substrate 12. The emitter regions 44 are formed in ranges that are in contact with the gate insulating film 56. The emitter regions 44 are n-type regions and have high impurity concentrations. The emitter regions 44 are ohmically connected to the emitter electrode 42.

The body layer 48 is a p-type layer. The body layer 48 is provided with body contact regions 48a and a low-concentration body layer 48b. The body contact regions 48a are formed in an island-like manner in ranges exposed on the upper surface of the semiconductor 12. Each body contact region 48a is formed between two emitter regions 44. The body contact regions 48a have a high impurity concentration. The body contact regions 48a are ohmically connected to the emitter electrode 42. The low-concentration body layer 48b is formed under the emitter regions 44 and the body contact regions 48a. The low-concentration body layer 48b is formed in a range shallower than lower ends of the gate electrodes 54. The impurity concentration in the low-concentration body layer 48b is lower than that in the body contact regions 48a. The emitter regions 44 are separated from the IGBT drift layer 50 by the low-concentration body layer 48b. The gate electrodes 54 face the low-concentration body layer 48b in ranges where the low-concentration body layer 48b separates the emitter regions 44 and the IGBT drift layer 50, via the gate insulating films 56.

The IGBT drift layer 50 is formed under the body layer 48. The IGBT drift layer 50 is an n-type layer. The IGBT drift layer 50 is provided with a drift layer 50a and a buffer layer 50b. The drift layer 50a is formed under the body layer 48. The drift layer 50a has a low impurity concentration. The drift layer 50a has an impurity concentration substantially equal to that of the diode drift layer 28, and is a layer continuous to the diode drift layer 28. The buffer layer 50b is formed under the drift layer 50a. The buffer layer 50b has an impurity concentration higher than that of the drift layer 50a.

The collector layer 52 is formed under the IGBT drift layer 50. The collector layer 52 is formed in a range exposed on the lower surface of the semiconductor substrate 12. The collector layer 52 is a p-type layer and has a high impurity concentration. The collector layer 52 is ohmically connected to the common electrode 60.

An IGBT is formed by the emitter regions 44, the body layer 48, the IGBT drift layer 50, the collector layer 52, and the gate electrodes 54.

A separation region 70 is formed between the diode region 20 and the IGBT region 40. The separation region 70 is formed in a range from the upper surface of the semiconductor substrate 12 to a depth deeper than a lower end of the anode layer 26 and a lower end of the body layer 48. The separation region 70 is in contact with the anode layer 26 and the body layer 48. The separation region 70 is a p-type region. An impurity concentration in the separation region 70 is higher than those in the low-concentration anode layer 26b and the low-concentration body layer 48b. The separation region 70 prevents an electric field from concentrating between the anode layer 26 and the body layer 48. In particular, the separation region 70 prevents an electric field from concentrating in the gate electrode 54 in the vicinity of the separation region 70.

The diode drift layer 28 and the drift layer 50a are connected under the separation region 70. Further, the cathode layer 30 and the collector layer 52 are in mutual contact below the separation region 70.

Lifetime control regions 39, 49, 59 are formed in the semiconductor substrate 12. A large number of crystal defects are present in the lifetime control regions 39, 49, 59. The concentration of crystal defects in the lifetime control regions 39, 49, 59 is much higher than that in the surrounding semiconductor layer.

The lifetime control region 39 is formed in the diode drift layer 28. The lifetime control region 39 is formed along an XY plane. The lifetime control region 39 is foamed at a depth close to the anode layer 26 and deeper than a lower end of the separation region 70.

The lifetime control region 59 is formed in the drift layer 50a. The lifetime control region 59 is formed along the XY plane. The lifetime control region 59 is formed at a depth close to the buffer layer 50b.

The lifetime control region 49 is fanned within an n-type region under the separation region 70 (that is a region where the diode drift layer 28 and the drift layer 50a are connected). The lifetime control region 49 is formed along a YZ plane. The lifetime control region 49 extends from an end portion 39a of the lifetime control region 39 to an end portion 59a of the lifetime control region 59.

The operation of the diode of the semiconductor device 10 will be explained below. When a voltage with which the anode electrode 22 will be positive (that is, a forward voltage) is applied between the anode electrode 22 and the common electrode 60, the diode is turned on. Thus, an electric current flows from the anode electrode 22 to the common electrode 60 via the anode layer 26, the diode drift layer 28, and the cathode layer 30. When the voltage applied to the diode is switched from the forward voltage to a reverse voltage, the diode performs a reverse recovery operation. Thus, holes that have been present in the diode drift layer 28 during the forward voltage application are discharged into the anode electrode 22, and electrons that have been present in the diode drift layer 28 during the forward voltage application are discharged into the common electrode 60. As a result, a reverse current flows in the diode. The reverse current attenuates within a short time and the electric current flowing in the diode thereafter becomes substantially zero. The crystal defects formed in the diode lifetime control region 39 function as carrier recombination centers. Therefore, most of the carriers present in the diode drift layer 28 are annihilated by recombination in the diode lifetime control region 39 during the reverse recovery operation. As a consequence, in the semiconductor device 10, the reverse current occurring during the reverse recovery operation is inhibited.

The operation of the IGBT of the semiconductor device 10 is explained below. When a voltage with which the common electrode 60 will be positive is applied between the emitter electrode 42 and the common electrode 60 and an ON potential (potential equal to or higher than a potential necessary to form channels) is applied to the gate electrodes 54, the IGBT turns on. Thus, when the ON potential is applied to the gate electrodes 54, the channels are formed in the low-concentration body layer 48b in ranges which are in contact with the gate insulating films 56. As a result, the electrons flow from the emitter electrode 42 to the common electrode 60 through the emitter regions 44, the channels, the IGBT drift layer 50, and the collector layer 52. Further, the holes flow from the common electrode 60 to the emitter electrode 42 through the collector layer 52, the IGBT drift layer 50, the low-concentration body 48b, and the body contact regions 48a. Thus, the current flows from the common electrode 60 to the emitter electrode 42. When the potential applied to the gate electrode 54 is switched from the ON potential to an OFF potential, the channel is eliminated. However, the current (referred to as "tail current") continues flowing in the IGBT for a short time due to the carriers remaining inside the drift layer 50a. The tail current attenuates within a short time and then the current flowing in the IGBT becomes substantially zero. The crystal defects formed in the lifetime control region 59 function as the carrier recombination centers. Therefore, during the turn-off operation, most of the carriers in the drift layer 50a are annihilated by the recombination in the lifetime control region 59. Therefore, in the semiconductor device 10, the tail current is unlikely to appear during the turn-off operation.

In the semiconductor device 10, the lifetime control region 49 is formed between the diode region 20 and the IGBT region 40 (below the separation region 70). The lifetime control region 49 prevents the above-described reverse current or tail current from flowing through between the diode drift layer 28 and the drift region 50a. The reverse current and tail current are thereby also inhibited.

Figure 2:
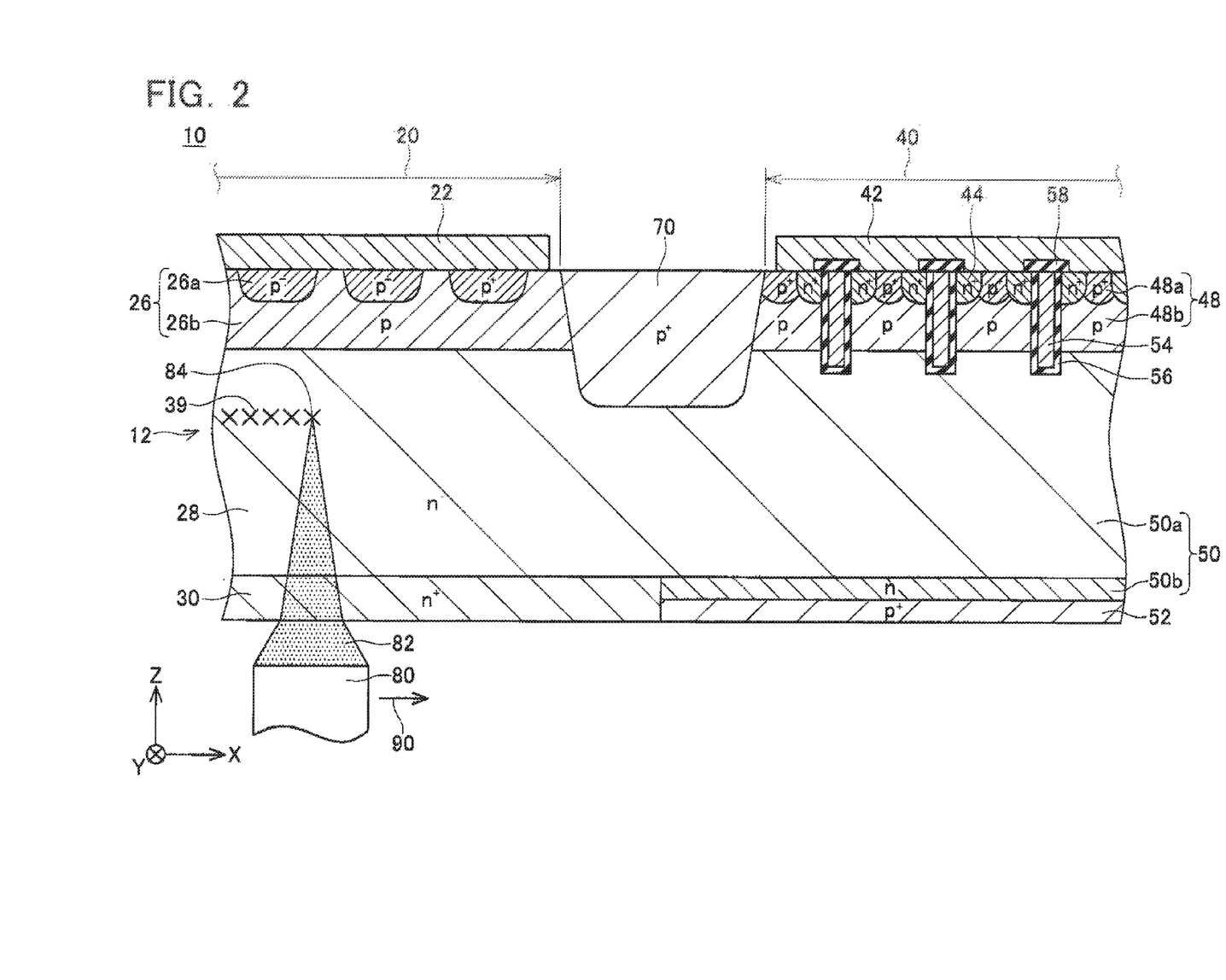
FIG. 2 is an explanatory drawing illustrating a step of irradiating laser light to the semiconductor substrate 12.

A method for manufacturing the semiconductor device 10 is described below. First, in the structure of the semiconductor device 10 shown in FIG. 1, the structure other than the lifetime control regions 39, 49, 59 and the common electrode 60 is formed by the conventional method. Then, as shown in FIG. 2, laser light 82 is irradiated to the semiconductor substrate 12 from a rear surface side of the semiconductor substrate 12 by a laser irradiation device 80. The irradiation of the laser light 82 is described below in greater detail.

The laser light 82 irradiated by the laser irradiation device 80 is near-infrared radiation. The laser irradiation device 80 is provided with a laser light source and an optical system that focuses the laser light 82 from the laser light source. The optical system is constituted by a plurality of lenses and the like. The laser light 82 irradiated from the laser irradiation device 80 is focused at a predetermined position.

When an intensity of the laser light 82 is low, the laser light 82, which is the near-infrared radiation, is transmitted by the semiconductor substrate 12 constituted by silicon. When the intensity of the laser light 82 (that is, photon density) is equal to or higher than a threshold, the two-photon absorption occurs in the semiconductor substrate 12. Therefore, in this case, the laser light 82 is absorbed by the semiconductor substrate 12. Thus, if the intensity of the laser light 82 increases, the optical absorptance of the semiconductor substrate 12 increases. The intensity of the laser light 82 is lower than the threshold at positions other than the focus point and higher than the threshold at the focus point.

When the laser light is irradiated to the semiconductor substrate 12, a distance between the semiconductor substrate 12 and the laser irradiation device 80 is initially adjusted. In this case, as shown in FIG. 2, the distance is adjusted so that a focus point 84 of the laser light 82 is made at the depth corresponding to the lifetime control region 39. The distance should be adjusted since the laser light 82 is refracted at the lower surface of the semiconductor substrate 12.

The laser light 82 is then irradiated by the laser irradiation device 80. The laser light irradiated from the laser irradiation device 80 has a low intensity outside the focus point 84. Therefore, the laser light enters the semiconductor substrate 12 and the focus point 84 thereof is made at the depth corresponding to the lifetime control region 39. In the focus point 84, the intensity of the laser light is high. As a result, the two-photon absorption occurs at the position of the focus point 84 in the semiconductor substrate 12 and the crystal defects are formed at this position. Further, a relative arrangement of the laser irradiation device 80 and the semiconductor device 12 is changed, as shown by an arrow 90 in FIG. 2, while irradiating the laser light 82. In this case, the relative arrangement is changed in the X direction and Y direction, without being changed in the Z direction. Thus, the focus point 84 is moved along the XY plane. The interior of the diode drift layer 28 is thus scanned by the focus point 84. As a result, a large number of crystal defects distributed along the XY plane is formed in the diode drift layer 28. Thus, the lifetime control region 39 is formed.

Figure 3:
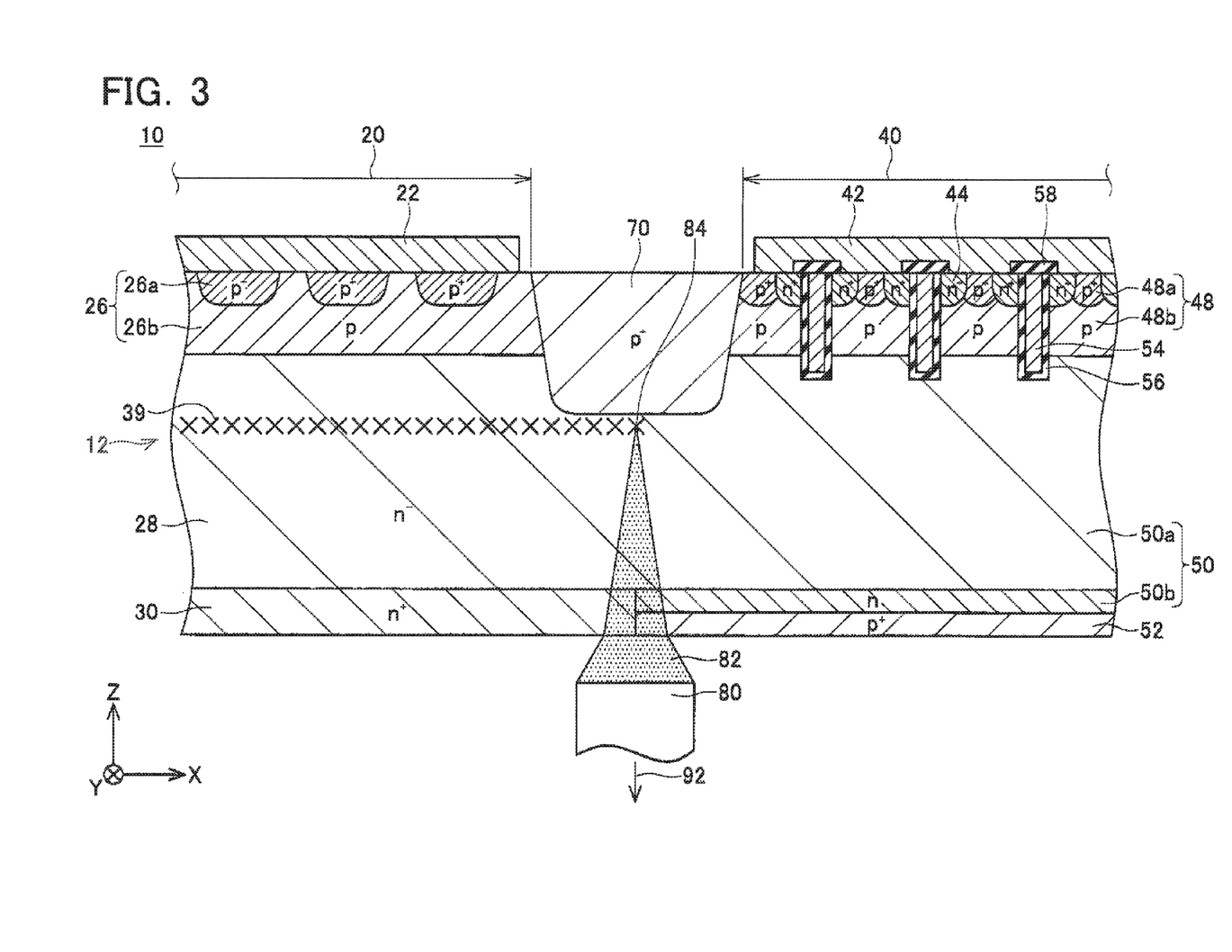
FIG. 3 is an explanatory drawing illustrating the step of irradiating the laser light to the semiconductor substrate 12.
Figure 4:
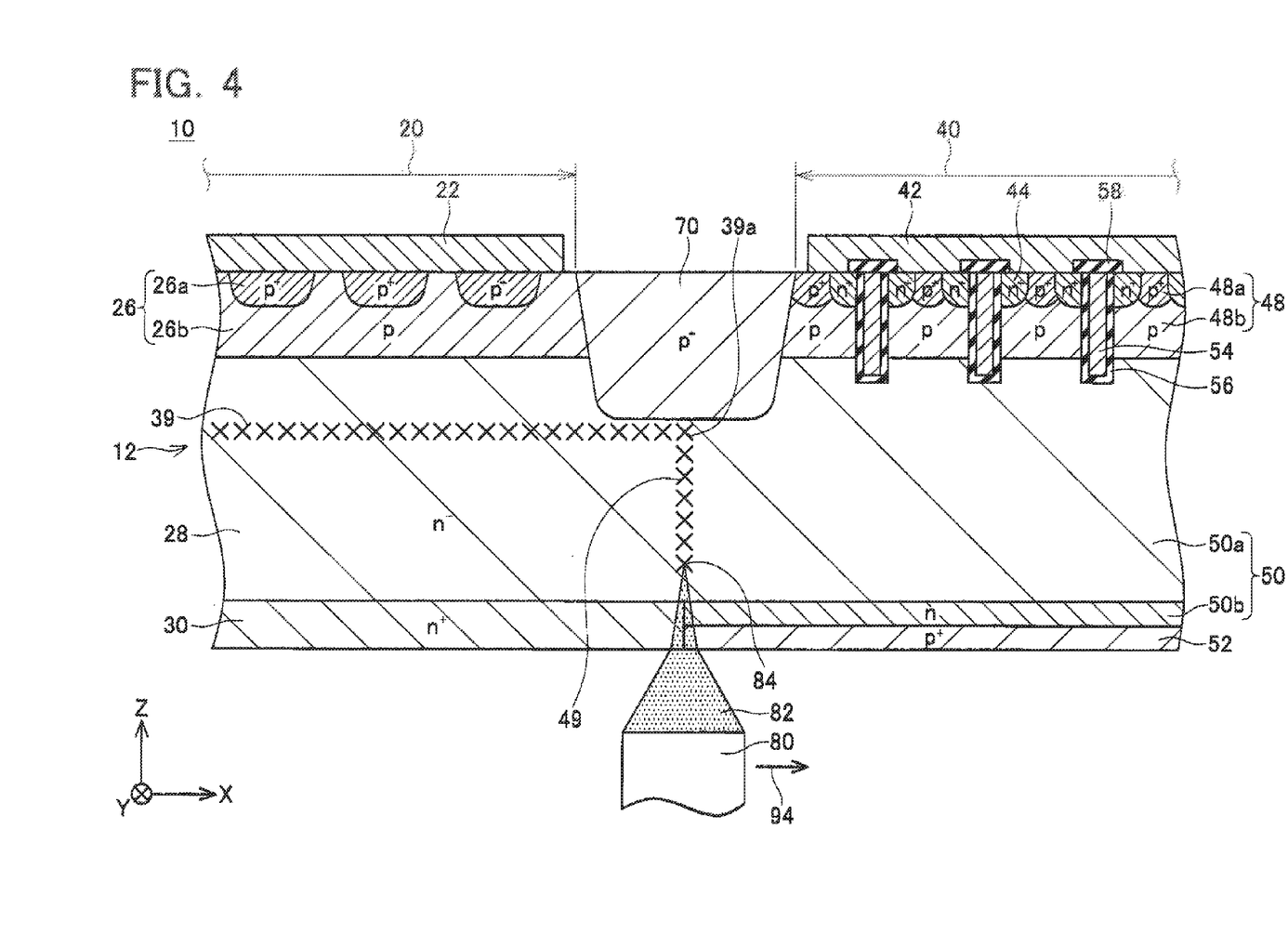
FIG. 4 is an explanatory drawing illustrating the step of irradiating the laser light to the semiconductor substrate 12.

Once the lifetime control region 39 has been formed as shown in FIG. 3, the lifetime control region 49 is then formed. Thus, the laser irradiation device 80 is moved as shown by an arrow 92 in FIG. 3 and the focus point 84 is moved along the YZ plane below the separation region 70. The region corresponding to the lifetime control region 49 is thus scanned by the laser light 82. As a result, a large number of crystal defects distributed along the YZ plane is formed as shown in FIG. 4. Thus, the lifetime control region 49 is formed.

Once the lifetime control region 49 has been formed, the lifetime control region 59 is then formed. Thus, the laser irradiation device 80 is moved as shown by an arrow 94 in FIG. 4, and the focus point 84 is moved along the XY plane at the depth corresponding to the lifetime control region 59. The region corresponding to the lifetime control region 59 is thus scanned by the laser light 82. As a result, a large number of crystal defects distributed along the XY plane is formed within the drift region 59a. Thus, the lifetime control region 59 is formed.

Once the lifetime control regions 39, 49, 59 have been formed by irradiation of the laser light, the semiconductor substrate 12 is subjected to low-temperature annealing at 300° C. to 500° C. The formed crystal defects are thereby stabilized.

Once the low-temperature annealing has been performed, the common electrode 60 is formed and then dicing is performed, thereby completing the manufacture of the semiconductor device 10.

As described hereinabove, with the technique in accordance with the present invention, the crystal defects can be formed at the positions of the focus point of the laser light, and the crystal defects are practically not formed at positions other than the focus points (position with the low intensity of the laser light). Therefore, with this technique, the crystal defects can be formed at the target depth, while inhibiting the formation of crystal defects at depths other than the target depth. As a result, the crystal defects can be distributed with fewer inhibitions than in the conventional method. Further, in a state in which the laser irradiation device 80 is not moved, crystal defects can be also formed only at the focus point position in the directions perpendicular to the irradiation direction of the laser (referred to as X direction and Y direction in the embodiment). Therefore, the crystal defects can be freely distributed by moving the position of the focus point 84 in the semiconductor substrate 12. Thus, the density of crystal defects can be controlled by controlling the speed at which the laser light is operated and the intensity of the laser light. Thus, it is not necessary to restrict the implantation range of charged particles by using a stencil mask or the like, as in the conventional methods for implanting charged particles, and crystal defects can be formed in a simpler manner.

Further, with the technique of the embodiment, the crystal defects can be distributed along the thickness direction of the semiconductor substrate 12 by moving the focus point 84 in the thickness direction of the semiconductor substrate 12. Since the crystal defects are distributed in the thickness direction in a state with controlled density, it is possible to manufacture a semiconductor device in which the crystal defects are distributed in a non-conventional manner. For example, the crystal defects can be distributed in the thickness direction with a constant density.

With the manufacturing method of the above-described embodiment, the lifetime control regions 39, 49, 59 are formed, but it is not necessary to form all of these lifetime control regions. Only some of them may be formed or crystal defects may be formed in other locations, as necessary.

Figure 5:
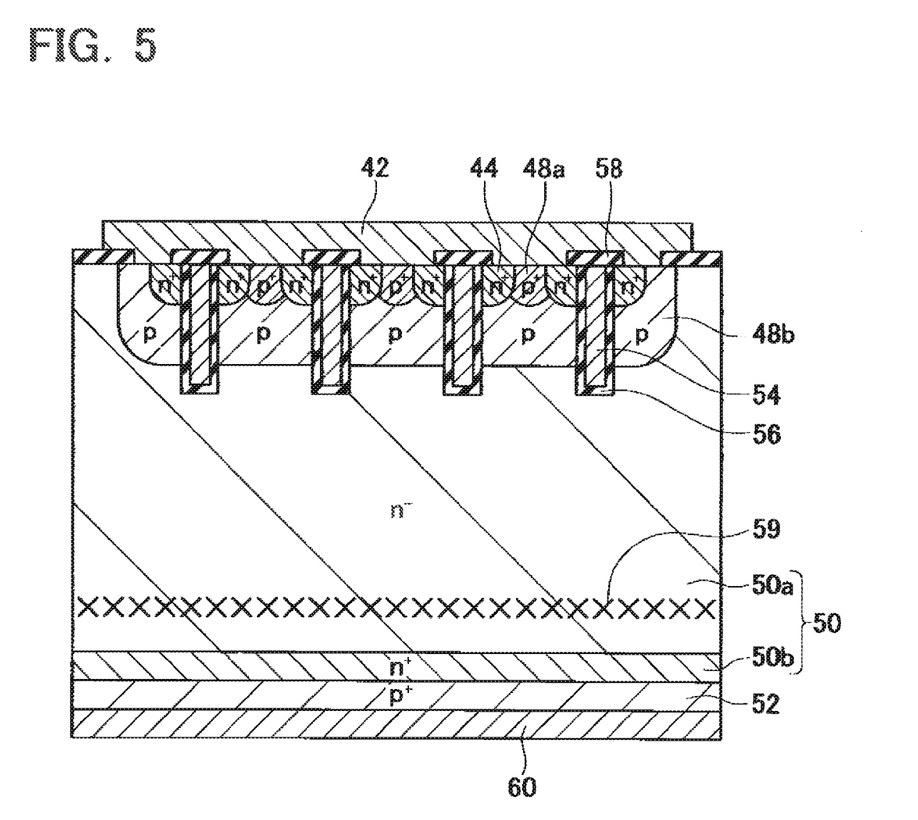
FIG. 5 is a cross-sectional view of a semiconductor device of a first variant.
Figure 6:
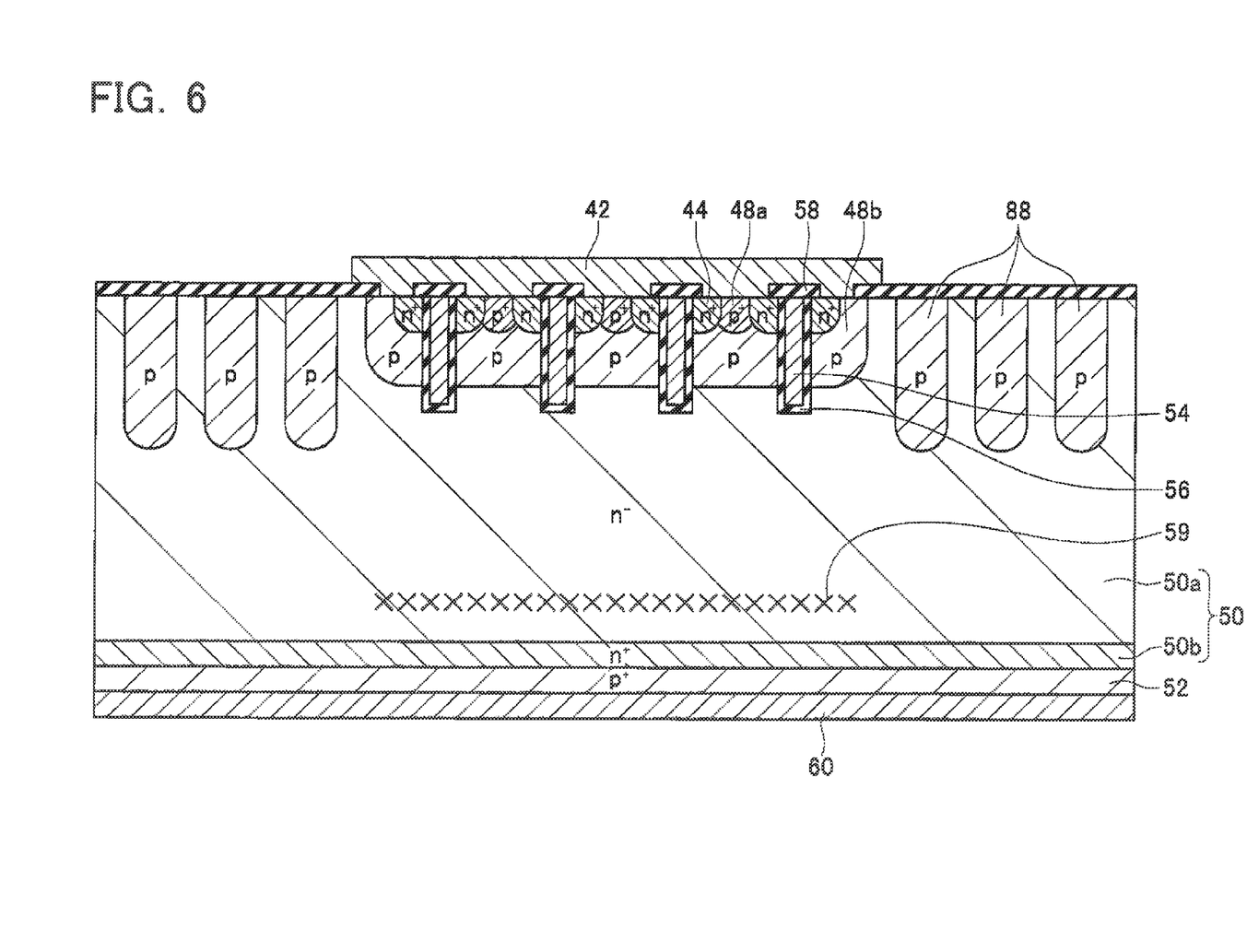
FIG. 6 is a cross-sectional view of a semiconductor device of a second variant.
Figure 7:
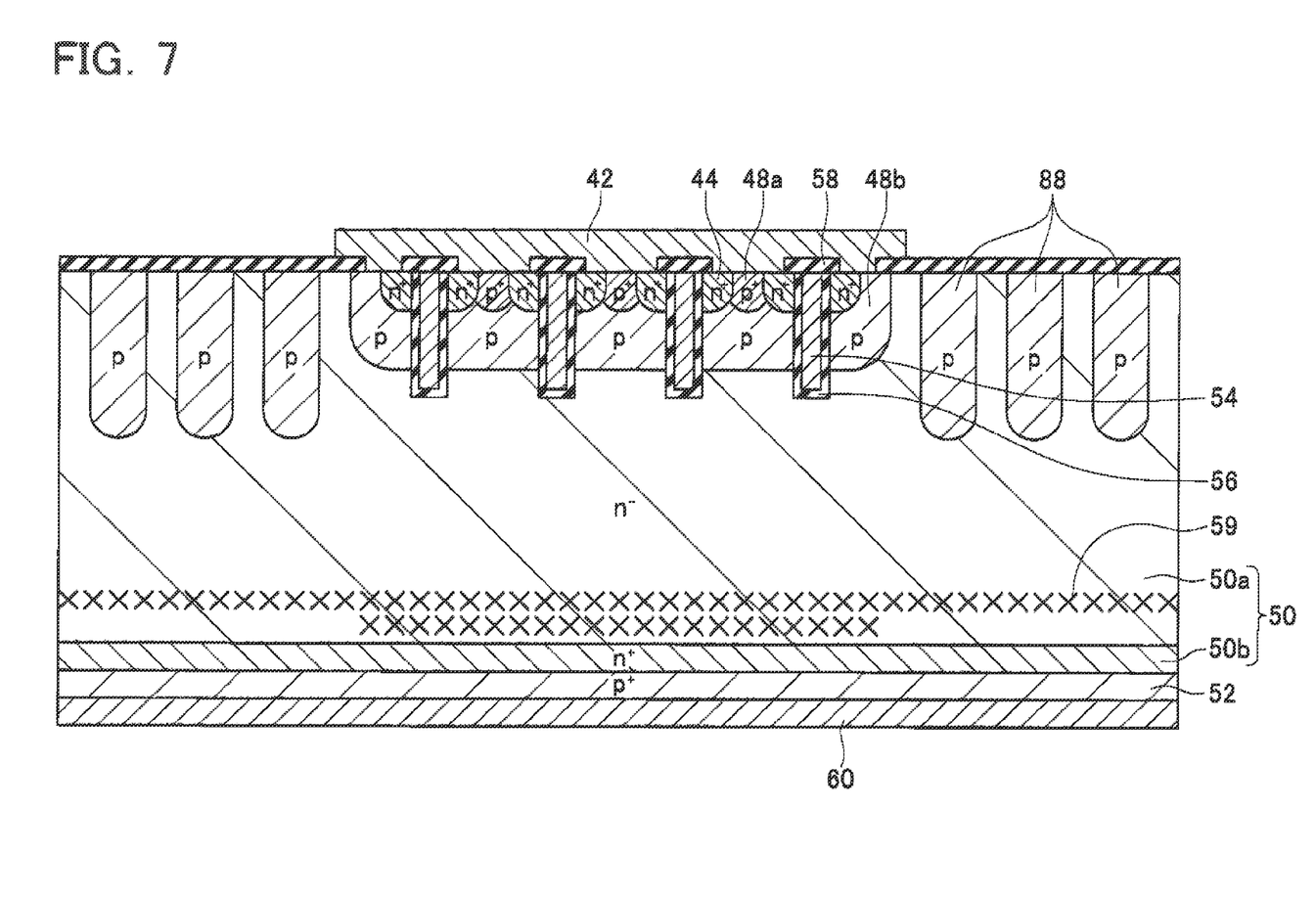
FIG. 7 is a cross-sectional view of a semiconductor device of a third variant.
Figure 8:
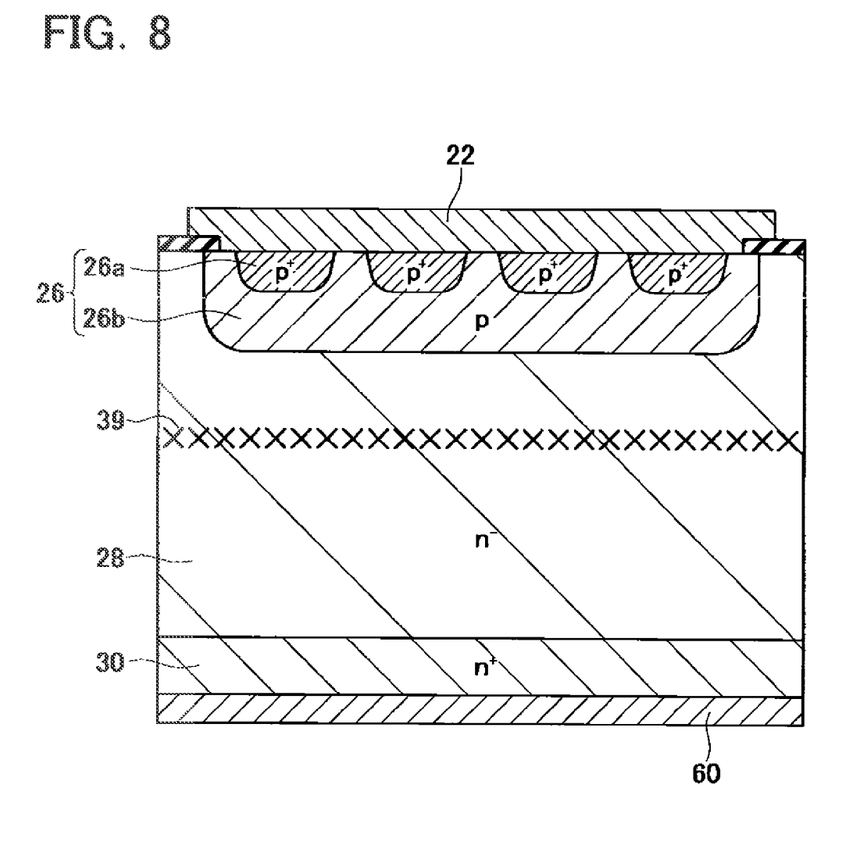
FIG. 8 is a cross-sectional view of a semiconductor device of a fourth variant.
Figure 9:
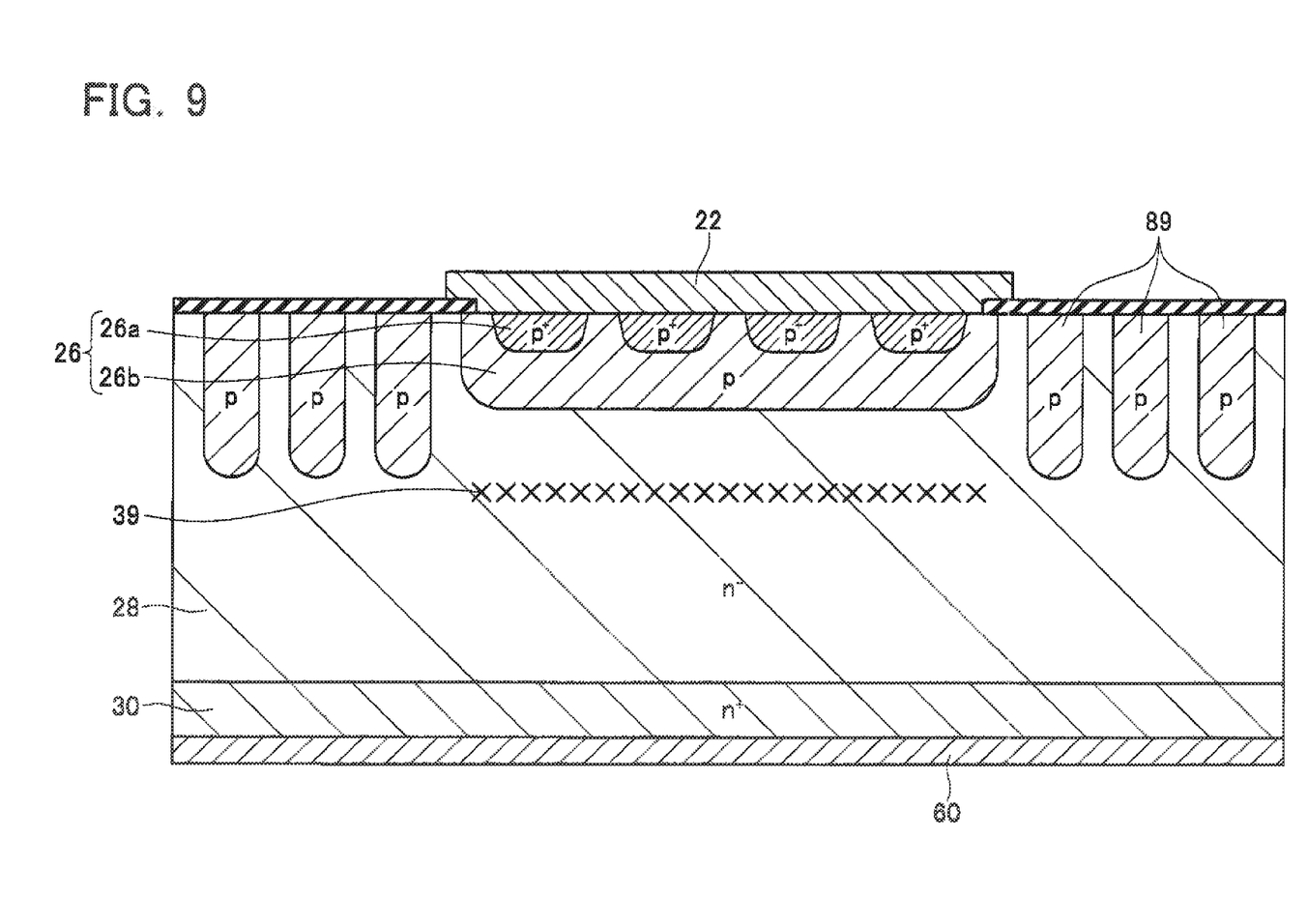
FIG. 9 is a cross-sectional view of a semiconductor device of a fifth variant.
Figure 10:
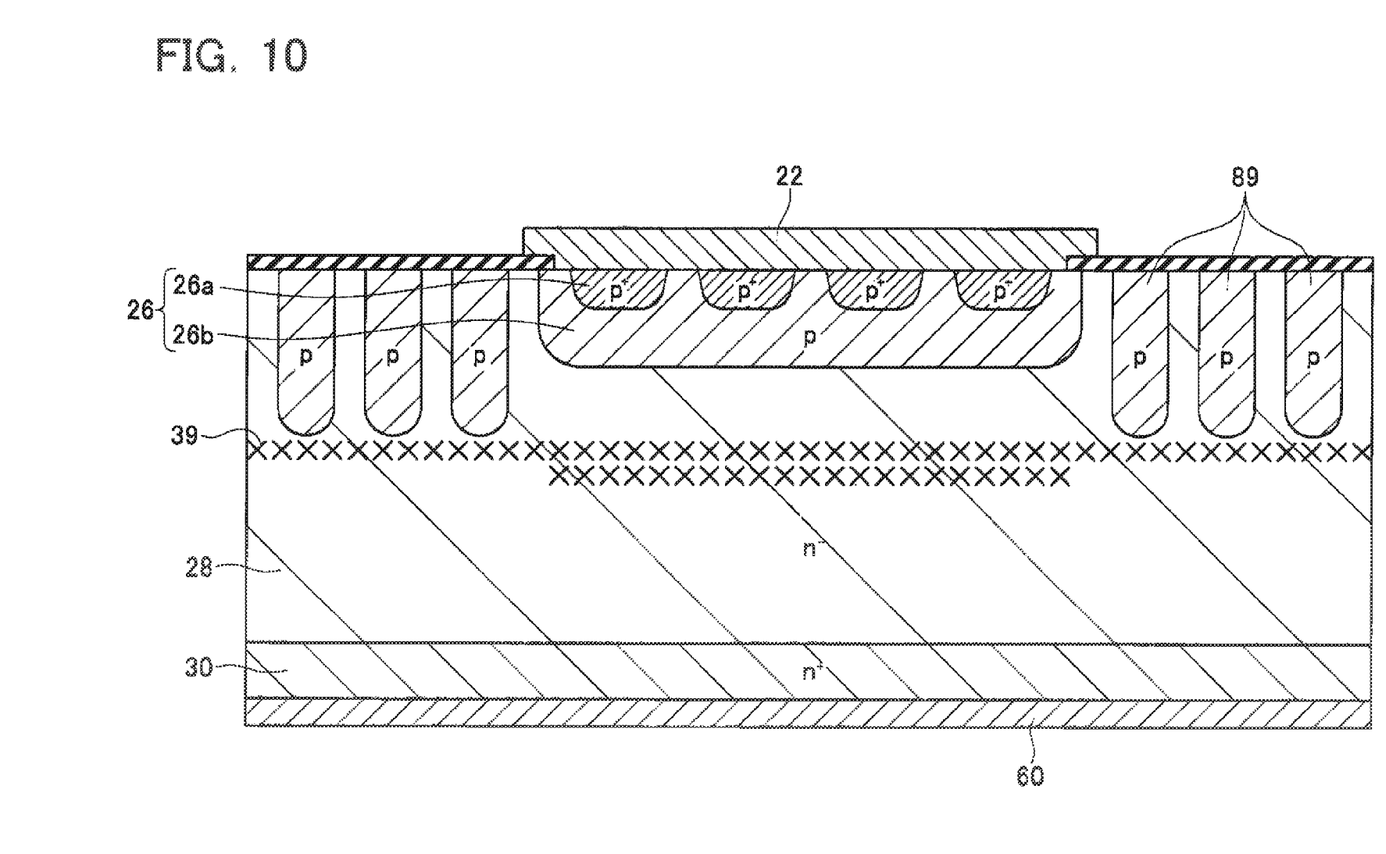
FIG. 10 is a cross-sectional view of a semiconductor device of a sixth variant.

Explained in the above-described embodiment is a method for manufacturing the semiconductor device 10 having the diode and the IGBT, but other semiconductor devices may be also manufactured by the technique disclosed in the present description. For example, a semiconductor device provided only with the IGBT may be manufactured as shown in FIG. 5. Further, a semiconductor device provided with a voltage-resistant structure such as an FLR88 around the IGBT may be also manufactured as shown in FIGS. 6 and 7. Further, the positions of the crystal defects can be changed as appropriate as shown in FIGS. 6 and 7. In the configuration shown in FIG. 6, the crystal defects (that is, the lifetime control region 59) are not formed in a lower part of the FLR88. In the configuration shown in FIG. 7, the crystal defects are formed in the lower part of the FLR88 and the crystal defects are formed with a large thickness in the lower part of the body region 48b. Further, a semiconductor device provided only with a diode may be also manufactured as shown in FIG. 8. Further, a semiconductor device provided with a voltage-resistant structure such as an FLR89 around the diode may be also manufactured as shown in FIGS. 9 and 10. Further, the positions of the crystal defects can be changed as appropriate as shown in FIGS. 9 and 10. In the configuration shown in FIG. 9, the crystal defects (that is, the lifetime control region 39) are not formed in the lower part of the FLR89. In the configuration shown in FIG. 10, the crystal defects are formed in the lower part of the FLR89 and the crystal defects are formed to a large thickness in the lower part of the anode region 26. Components of the above-described semiconductor devices shown in FIGS. 5 to 10 and the semiconductor device shown in FIG. 1 that have the same functions are assigned with same reference numerals.

The invention claimed is:

1. A method for manufacturing a semiconductor device, comprising:

irradiating light to a semiconductor substrate, wherein a wavelength of the light is a wavelength adapted so that light absorptance of the semiconductor substrate increases if an intensity of the light increases, and the light is irradiated so that a focus point of the light is made in a region which is within the semiconductor substrate and, dividing the semiconductor substrate into semiconductor devices so that said region is included in at least an internal portion of a semiconductor layer of at least one of the semiconductor device, wherein the internal portion is not located at a surface of the semiconductor layer, wherein an IGBT is formed in the semiconductor substrate, and the focus point is made within a drift region of the IGBT.

2. A method for manufacturing a semiconductor device, comprising:

irradiating light to a semiconductor substrate, wherein a wavelength of the light is a wavelength adapted so that light absorptance of the semiconductor substrate increases if an intensity of the light increases, and the light is irradiated so that a focus point of the light is made in a region which is within the semiconductor substrate and, dividing the semiconductor substrate into semiconductor devices so that said region is included in at least an internal portion of a semiconductor layer of at least one of the semiconductor device, wherein the internal portion is not located at a surface of the semiconductor layer, wherein a diode is formed in the semiconductor substrate, and the focus point is made within a drift region of the diode.

3. A method for manufacturing a semiconductor device, comprising:

irradiating light to a semiconductor substrate, wherein a wavelength of the light is a wavelength adapted so that light absorptance of the semiconductor substrate increases if an intensity of the light increases, and the light is irradiated so that a focus point of the light is made in a region which is within the semiconductor substrate and, dividing the semiconductor substrate into semiconductor devices so that said region is included in at least an internal portion of a semiconductor layer of at least one of the semiconductor device, wherein the internal portion is not located at a surface of the semiconductor layer, wherein an IGBT and a diode are formed in the semiconductor substrate, a drift region of the IGBT and a drift region of the diode are consecutive, and the focus point is moved between the drift region of the IGBT and the drift region of the diode.

* * * * *